(12) United States Patent
Wyland

(10) Patent No.: US 8,134,073 B2
(45) Date of Patent: Mar. 13, 2012

(54) METHOD AND SYSTEM FOR COMPOSITE BOND WIRES

(75) Inventor: Chris Wyland, Livermore, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 59 days.

(21) Appl. No.: 12/302,492

(22) PCT Filed: May 25, 2007

(86) PCT No.: PCT/IB2007/051972
§ 371 (c)(1),
(2), (4) Date: Jul. 17, 2009

(87) PCT Pub. No.: WO2007/138535
PCT Pub. Date: Dec. 6, 2007

(65) Prior Publication Data
US 2009/0301757 A1    Dec. 10, 2009

(51) Int. Cl.
*H01B 12/00* (2006.01)
(52) U.S. Cl. ............... 174/126.1; 174/126.2; 428/380; 428/384; 428/471; 428/552; 505/230; 505/704; 505/740; 505/813
(58) Field of Classification Search ......... 174/113 R, 174/126.1, 126.2; 428/380, 384, 471, 552; 505/230, 704, 740, 813
See application file for complete search history.

(56) References Cited

U.S. PATENT DOCUMENTS

| | | | | |
|---|---|---|---|---|
| 4,971,944 A | * | 11/1990 | Charles et al. | 505/470 |
| 4,983,574 A | * | 1/1991 | Meyer | 505/124 |
| 5,024,902 A | * | 6/1991 | Suganuma et al. | 428/633 |
| 5,082,826 A | * | 1/1992 | Ferrando | 505/236 |
| 5,364,706 A | * | 11/1994 | Toyofuku et al. | 428/607 |
| 5,414,403 A | * | 5/1995 | Greuter et al. | 338/22 R |
| 5,470,821 A | * | 11/1995 | Wong et al. | 505/236 |
| 5,925,467 A | | 7/1999 | Strumpler et al. | |
| 5,929,385 A | * | 7/1999 | Sugimoto et al. | 174/125.1 |
| 6,121,122 A | | 9/2000 | Dunn et al. | |
| 6,305,070 B1 | * | 10/2001 | Masur et al. | 29/599 |
| 6,528,729 B1 | | 3/2003 | Kamata | |
| 6,649,843 B2 | * | 11/2003 | Aoyama et al. | 174/126.1 |
| 6,700,067 B1 | * | 3/2004 | Gubser et al. | 174/125.1 |

(Continued)

FOREIGN PATENT DOCUMENTS

JP    62124761 A1    6/1987

(Continued)

OTHER PUBLICATIONS

Chinese Patent Office, Office Action dated Aug. 23, 2010; Application No. 200810212852.1, 4 pages.

(Continued)

*Primary Examiner* — Cathy Lam
(74) *Attorney, Agent, or Firm* — Haynes and Boone, LLP

(57) ABSTRACT

Bond wires for integrated circuits are implemented using a variety of methods. Using one such method, a composite bond wire is produced for use in an integrated circuit. A conductive material is melted and mixed with a material of particles less than 100 micrometers in size to create a mixture. The mixture is used to create the composite bond wire. A composite wire having an inner core and an outer layer having a higher conductivity than the inner core is also provided. The outer layer is designed to be thicker than the skin depth at the operating frequency for carrying AC signals.

18 Claims, 3 Drawing Sheets

U.S. PATENT DOCUMENTS

| | | | |
|---|---|---|---|
| 6,753,674 B2 * | 6/2004 | Grundl et al. | 323/224 |
| 6,899,777 B2 * | 5/2005 | Vaidyanathan et al. | 156/89.11 |
| 7,087,953 B2 * | 8/2006 | Lee | 257/315 |
| 7,282,386 B2 * | 10/2007 | Khemka et al. | 438/92 |
| 7,319,196 B2 * | 1/2008 | LeFranc et al. | 174/126.1 |
| 7,326,463 B2 * | 2/2008 | Aisenbrey | 428/372 |
| 7,332,787 B2 * | 2/2008 | Ku et al. | 257/471 |
| 7,485,941 B2 * | 2/2009 | Levin et al. | 257/476 |
| 2004/0014266 A1 * | 1/2004 | Uno et al. | 438/200 |
| 2005/0201173 A1 | 9/2005 | Sharma et al. | |

FOREIGN PATENT DOCUMENTS

| | | |
|---|---|---|
| JP | 11111752 A | 4/1999 |
| WO | 2005012435 A1 | 2/2005 |

OTHER PUBLICATIONS

Sankaran, S., et al., "Schottky Barrier Diodes for Millimeter Wave Detection in a Foundry CMOS Process," IEEE Electron Device Letters, vol. 26, No. 7, Jul. 2005, p. 492-494.

* cited by examiner

METHOD AND SYSTEM FOR COMPOSITE BOND WIRES

The present invention relates generally to integrated circuit (IC) packaging and, more particularly, to the implementation of bond wires for semiconductor devices.

The electronics industry continues to rely upon advances in semiconductor technology to realize higher-function devices in more compact areas. For many applications, realizing higher-functioning devices requires integrating a large number of electronic devices into a single silicon wafer. As the number of electronic devices per given area of the silicon wafer increases, the manufacturing process becomes more difficult.

Many varieties of semiconductor devices have been manufactured with various applications in numerous disciplines. Such silicon-based semiconductor devices often include metal-oxide-semiconductor field-effect transistors (MOSFET), such as p-channel MOS (PMOS), n-channel MOS (NMOS) and complementary MOS (CMOS) transistors, bipolar transistors, or BiCMOS transistors. Such MOSFET devices include an insulating material between a conductive gate and silicon-like substrate; therefore, these devices are generally referred to as IGFETs (insulated-gate FET).

Each of these semiconductor devices generally includes a semiconductor substrate on which a number of active devices are formed. The particular structure of a given active device can vary between device types. For example, in MOS transistors, an active device generally includes source and drain regions and a gate electrode that modulates current between the source/drain regions.

Furthermore, such devices may be digital or analog devices produced in a number of wafer fabrication processes, for example, CMOS, BiCMOS, Bipolar, etc. The substrates may be silicon, gallium arsenide (GaAs) or other substrate suitable for building microelectronic circuits thereon.

After undergoing the process of fabrication, the silicon wafer has a predetermined number of devices. These devices are tested and functional devices are collected and packaged.

The packaging of complex IC devices is increasingly playing a role in their ultimate performance. Many packages include a substrate upon which a device die is mounted on a predetermined die attach area surrounded by pad landings. The device die itself has bonding pads to facilitate its connection to the outside world via bond wires attached to respective bonding pads from their respective pad landings surrounding the die attach area. The pad landings connect to external contacts through electrical traces defined in the substrate. In some package types, the assembled device is protected from environmental damage through encapsulation in a suitable molding compound.

As devices grow in complexity the number of wire bonds approaches hundreds. Such complex products include laptop computers, portable digital assistants (PDAs), wireless telephones, automotive electronic control modules, etc.

Materials used in wire bonding of IC devices to package substrate are often precious metals or other costly materials. For instance, a common materials used in wire bonding include gold, aluminum, copper, palladium-alloy, platinum and silver. Gold has a number of properties making it eminently suitable, for example, its conductivity, corrosion resistance, and malleability. In particular, gold's malleability permits the user to form and draw out the metal into fine shapes, such as the microscopically fine bond wire used in IC devices. Additionally, gold bonds well with the various IC devices.

As the demand for complex electronics products increase, so does the consumption of the wire bonding materials. With increasing demand in the electronics and other industries coupled with a limited supply worldwide, the cost of the materials inexorably rises.

Various aspects of the present invention are directed to methods and arrangements for implementing bond wires in a manner that addresses and overcomes the above-mentioned issues.

Consistent with one example embodiment, the present invention is directed to a composite bond wire having an inner portion of the composite bond wire and an outer layer of conductive material. The electrical resistance of the outer layer has a lower electrical resistance than the electrical resistance of the inner portion.

Consistent with a further example embodiment, the present invention is directed to a method used for producing a composite bond wire suitable for an integrated circuit. A conductive material is melted and mixed with a ceramic material to create a mixture of the conductive material and the ceramic material. The mixture is used to create a composite bond wire.

The above summary of the present invention is not intended to describe each embodiment or every implementation of the present invention. Advantages and attainments, together with a more complete understanding of the invention, will become apparent and appreciated by referring to the following detailed description and claims taken in conjunction with the accompanying drawings.

The invention may be more completely understood in consideration of the following detailed description of various embodiments of the invention in connection with the accompanying drawings, in which.

Figure 1A:
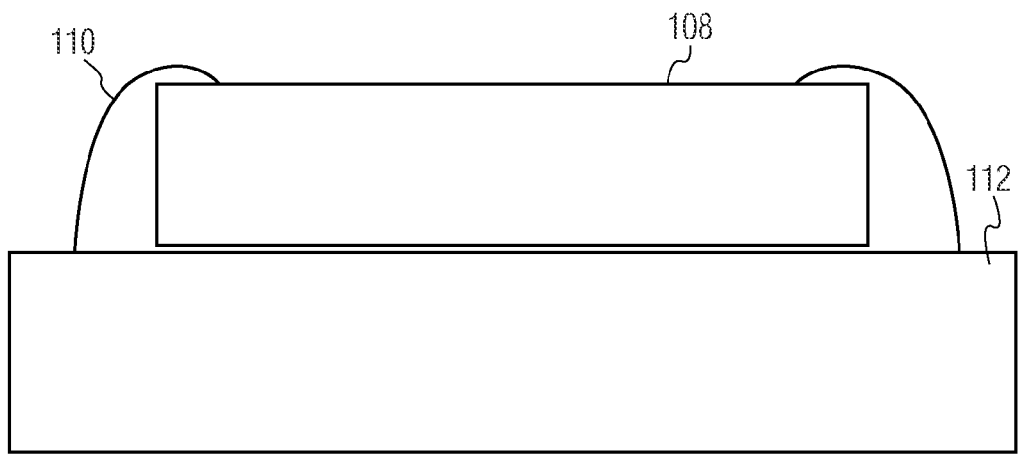
FIG. 1A-1C show implementations of an integrated circuit using bond wires, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention as defined by the appended claims.

The present invention is believed to be applicable to a variety of integrated circuits and approaches involving bond wires. While the present invention is not necessarily limited to such applications, an appreciation of various aspects of the invention is best gained through a discussion of examples in such an environment.

Consistent with an example embodiment of the present invention, an integrated circuit device is constructed using one or more composite bond wires constructed of a mixture of a material having a high conductivity and submicron particles having a lower conductivity.

Another example embodiment of the present invention includes a method of constructing composite bond wires. A first material having a low conductivity is used to create a bond wire. The bond wire is coated with a layer of a second material having a high conductivity. The thickness of the layer is determined by the expected frequency of signals to be transmitted through the bond wires.

In a particular embodiment, the thickness of the second layer corresponds to the computation of the skin effect or skin depth of the bond wire. The behavior of electrical conductors at increasing frequency has been described as the skin effect. The skin effect causes the effective resistance of the conductor to increase with the frequency of the current.

In the following example, the current density J in an infinitely thick plane conductor decreases exponentially with depth 6 from the surface, as follows:

$$J = J_S e^{-\delta/d} \quad (1)$$

where d is a constant called the skin depth. This is defined as the depth below the surface of the conductor at which the current is 1/e (about 0.37) times the current at the surface ($J_S$). It can be calculated as follows:

$$d = \sqrt{\frac{2\rho}{\omega\mu}} \quad (2)$$

where
ρ=resistance of the conductor
ω=angular frequency of the current=2π×frequency
μ=absolute magnetic permeability of the conductor The resistance of a flat slab (much thicker than d) to alternating current is essentially equal to the resistance of a plate of thickness d to direct current. For long, thin conductors such as wires, the resistance is approximately that of a hollow tube with wall thickness d carrying direct current. For example, for a round wire, the AC resistance is approximately:

$$R = \frac{\rho}{d}\left(\frac{L}{\pi(D-d)}\right) \approx \frac{\rho}{d}\left(\frac{L}{\pi D}\right) \quad (3)$$

where
L=length of conductor
D=diameter of conductor
The final approximation above is accurate if D>>d.

A convenient formula (attributed to F. E. Terman) for the diameter $D_W$ (mm) of a wire of circular cross-section whose resistance will increase by 10% at frequency f (hertz) is:

$$D_W = \frac{200}{\sqrt{f}} \quad (4)$$

Below, the approximate skin depth at various frequencies is shown for a copper wire.

TABLE 1

| Frequency | Δ |
|---|---|
| 60 Hz | 8.57 mm |
| 10 kHz | 0.66 mm |
| 100 kHz | 0.21 mm |
| 1 MHz | 66 μm |
| 10 MHz | 21 μm |

Thus, for a given cross-sectional area of wire, the flow of current at increasing frequency occurs at a smaller distance from the wire surface. Using the skin effect, it is possible to reduce the metal content of a metal bond wire because, as the frequency increases, less of the cross-sectional area of the wire is relevant to the effective resistance of the bond wire. For example, a wire made to operate at a 100 KHz could be constructed using about 0.21 mm of copper surrounding an inner core of lower conductivity material.

With respect to bond wires used in the packaging of high performance semiconductor device and constructed from a precious metal, such as gold, the present invention has been found useful in reducing the metal content of bond wires. At high frequencies, it is possible to construct a bond wire having a core of lower conductivity material surrounded by a predetermined thickness of higher conductivity metal. The thickness of higher conductivity metal can be made relatively thin for higher frequency applications or thicker for lower frequency applications.

Figure 1B:
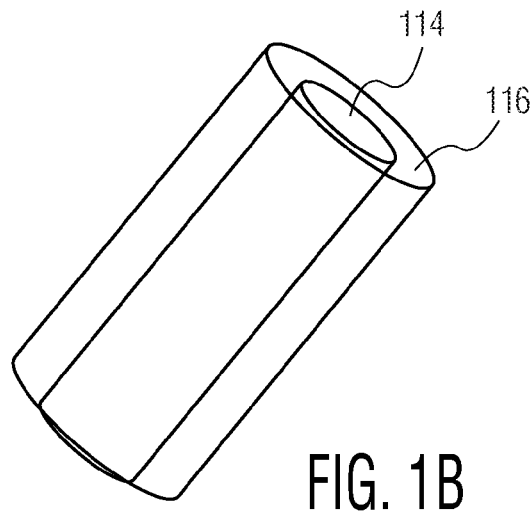
Figure 1C:
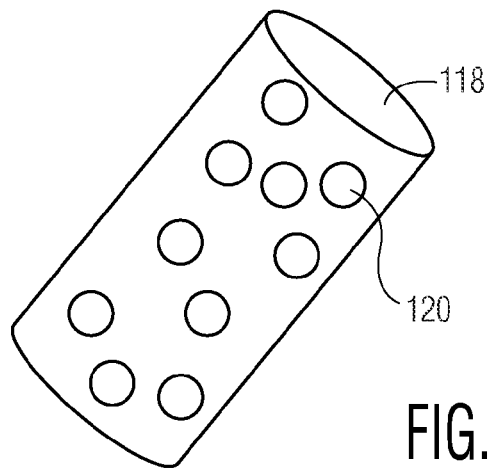

Turning now to the figures, FIG. 1 shows an integrated circuit arrangement using bond wires, according to an example embodiment of the present invention. FIG. 1A shows die 108, substrate 112 and composite bond wire 110. Various embodiments of bond wire 110 are shown in more detail by FIGS. 1B and 1C.

Die 108 is mounted on substrate 112 and is electrically connected to pads on the substrate using bond wire 110. The integrated circuit arrangement depicted in FIG. 1A is merely one example of many possible integrated circuit designs in which bond wires are used to electrically connect various components of the integrated circuit. Examples of other integrated circuits using wire bonds include stacked die arrangements and die-down arrangements. Bond wire 110 is consistent with the various teachings herein.

FIG. 1B shows one example implementation of bond wire 110. An inner portion 114 of the bond wire has a low conductivity, while an outer portion 116 has a higher conductivity. The conductivity and thickness of the inner and outer portions corresponds to the particular application. For applications that are limited to high frequency signals, the outer portion is relatively thin and the inner portion can have little to no conductivity. For applications that are limited to lower frequency signals, the outer portion is thicker and the inner portion may still have little to no conductivity. For applications that require low conductivity for high frequency as well as lower conductivity for direct current, the outer portion is relatively thin and the inner portion has sufficient DC conductivity. Various other combinations of inner and outer portions thickness and conductivity are envisioned. In a specific example, the thickness of the outer layer is determined by the expected skin depth of the bond wire in the application.

The characteristics (e.g., conductivity and flexibility) of the inner portion of the bond wire can be controlled using different methods. A first method involves selecting a material that exhibits the desired characteristics and forming the inner portion from the material. Thus, conductive materials (such as copper, aluminum, nickel, and silver) as well as insulating materials (such as ceramics) can be used to form the inner portion. The outer portion of the bond wire is formed from a material that meets the electrical requirements of the application as determined by the signal frequency and conductivity requirements.

A second method involves mixing a lower conductivity material with a higher conductivity material. This mixture forms the inner portion of the bond wire. In a specific example, the lower conductivity material is submicron ceramic particles, and the higher conductivity material is a metal, such as gold. The outer portion is formed from either a pure form of the higher cost material or from a mixture that has an increased ratio of higher conductivity material to lower conductivity material (as compared to the inner portion). Example submicron ceramic particles include materials, such as oxides, carbides, borides or nitrides. Other, specific examples of ceramic particles include alumina, beryllia or steatite. Alternatively, conductive submicron particles can be used.

FIG. 1C shows another one example implementation of bond wire 110. The bond wire 110 is formed using a conductive material 118 and submicron particles 120. In one instance, the submicron particles consist of a lower cost material with less than ideal electrical properties. A higher density of submicron particles reduces the total volume of conductive material 118 in a bond wire, and thus, can reduce the cost of the bond wire. However, the density of the submicron particles within the bond wire 110 also affects the conductivity of the bond wire because as the density of the submicron particles is increased, the conductivity of the bond wire decreases. It is therefore advantageous to balance the cost of the bond wire with the desired conductivity of the bond wire. For instance, the conductive material 118 may be gold, while submicron particles 120 may be a ceramic powder that is mixed with melted gold. In certain applications, gold exceeds the minimum conductivity requirements of the application but is still the most cost effective material. By mixing a certain quantity of ceramic powder into the gold, the amount of gold in a bond wire of a certain thickness can be reduced while maintaining the minimum conductivity requirements, thereby reducing the cost of the bond wire.

In another embodiment, the bond wire of FIG. 1C can be coated with a high conductivity layer to increase the conductivity of the wire relative to high frequency signals. The layer can be a function of the skin depth of the high frequency signals. Moreover, the density of the submicron particles within the inner portion of the wire may be a function of lower frequency signal requirements or direct current requirements of the bond wire.

Figure 2:
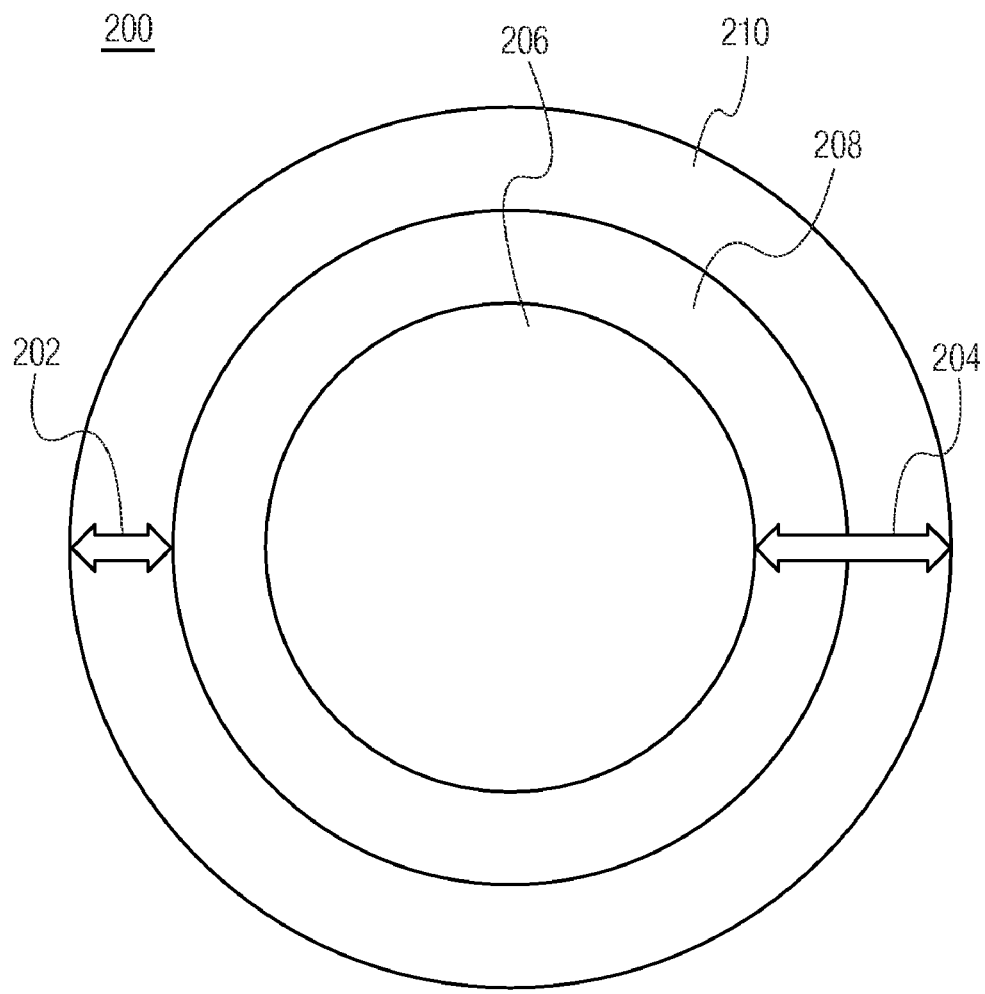
FIG. 2 depicts a cross-section of a bond wire, according to an example embodiment of the present invention.

FIG. 2 shows another example embodiment of the present invention. FIG. 2 depicts a cross-section of a bond wire having multiple layers 206 through 210 with the layers configured according to a skin depth 202 and 204. The bond wire 200 is shown having three different layers, however, the number of layers can be varied depending upon the application. Layer 210 is a high conductivity layer configured for a first skin depth 202. This skin depth corresponds to a high frequency ω1. Layer 208 is a layer having less conductivity than layer 210 and a skin depth of 204. The skin depth 204 corresponds to a second frequency ω2. Layer 206 is a layer having the least conductivity, if any, and is selected for frequencies lower than ω2 and for any direct current requirements. Such multi-layering can be particularly useful because high frequency signals often require lower conductivity than low frequency signals due to precise timing margins for many high frequency signals and because some applications have different signal frequencies used on the same bond wire.

Figure 3:
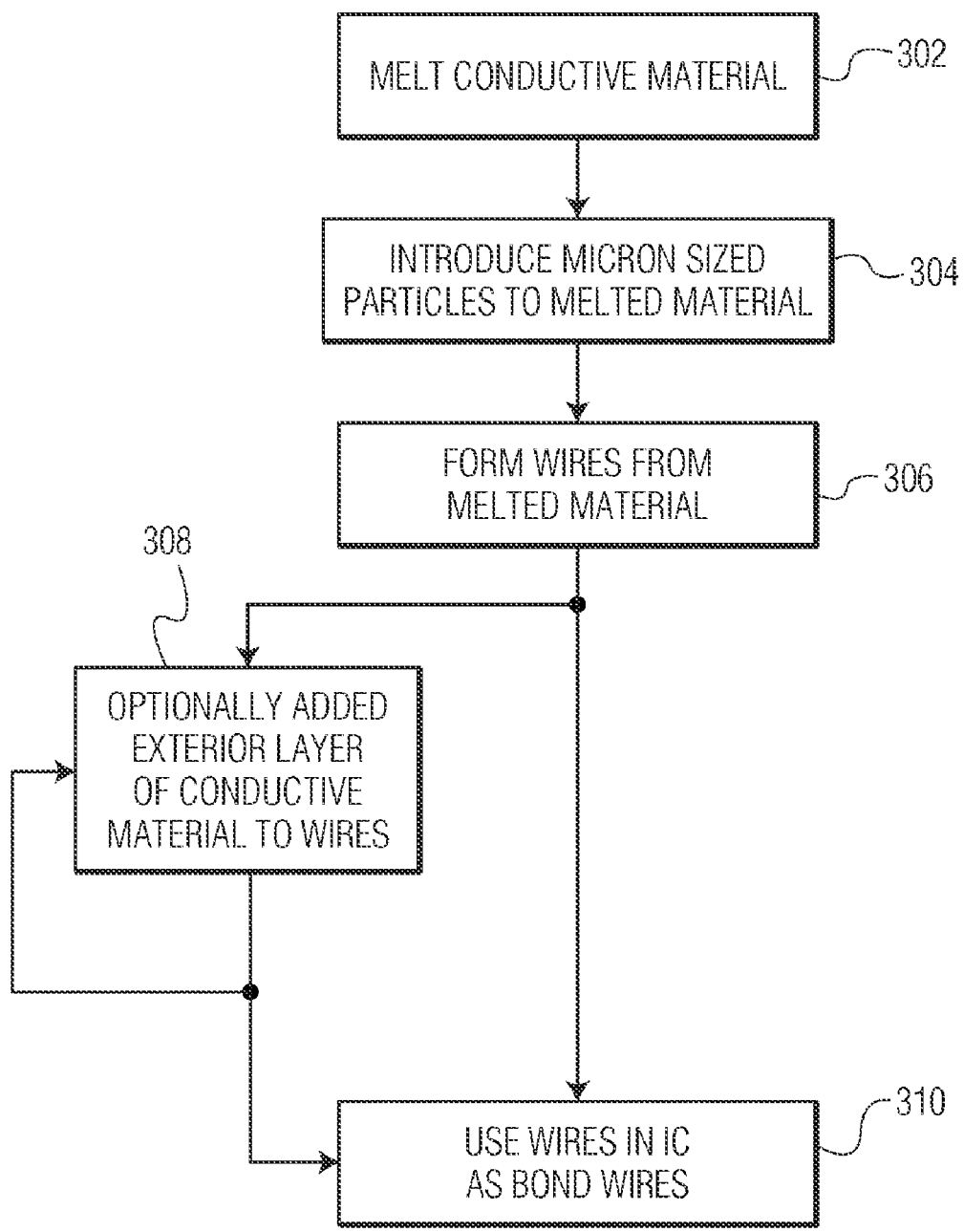
FIG. 3 is a flow chart showing method for producing bond wires, according to an example embodiment of the present invention.

FIG. 3 shows a method for producing bond wires, according to another example embodiment of the present invention. A first conductive material is melted as shown by block 302. For example, the conductive material is melted by heating the material past its melting point. Submicron particles are introduced to the melted material as shown by block 304. The density of the submicron particles can be determined by assessing the required electrical and physical characteristics of the final bond wire. A specific example of submicron particles includes commercially available ceramic powders. These particles generally are available for relatively low cost and do not break down at the high heat required for melting many metals.

The resulting mixture is formed into wires, as shown by block 306. In a specific example of forming wires, the mixture is "drawn" or "pulled" to the desired wire diameter, however, other wire formation techniques are also envisioned. The wire is then optionally coated with one or more layers of higher conductivity material as shown in block 308. Thus, the additional layers can be constructed to meet more stringent electrical characteristics (e.g., conductivity for higher frequencies). After the final layer is added, the bond wire is used in the integrated circuit as shown by block 310.

The various embodiments described above and shown in the figures are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. For instance, applications other than metal and ceramic bond-wires may be amenable to implementation using similar approaches. Such modifications and changes do not depart from the true scope of the present invention that is set forth in the following claims.

The invention claimed is:

1. For use in an integrated circuit, a composite bond wire electrically connecting components of the integrated circuit, the composite bond wire comprising:
    an inner portion comprising a material having a first component and a second component at a first ratio, the material at the first ratio having an electrical resistance; and
    an outer layer surrounding the inner portion, the outer layer comprising the material having the first component and the second component at a second ratio, the material at the second ratio having a lower electrical resistance than the inner portion,
    wherein the inner portion has a first thickness that is greater than a first skin depth ($d_1$), the first skin depth ($d_1$) described by a first model equation expressed as:

$$d_1 = \sqrt{\frac{2\rho_1}{\omega_1 \mu_1}}$$

wherein $\rho_1$ denotes resistivity of the inner portion, $\omega_1$ denotes a first frequency of electrical signals to be applied to the composite bond wire, and $\mu_1$ denotes absolute magnetic permeability of the inner portion,
   wherein the outer layer has a second thickness that is greater than a second skin depth ($d_2$), the second skin depth ($d_2$) described by a second model equation expressed as:

$$d_2 = \sqrt{\frac{2\rho_2}{\omega_2 \mu_2}}$$

wherein $\rho_2$ denotes resistivity of the outer layer, $\omega_2$ denotes a second frequency of electrical signals to be applied to the composite bond wire, and $\mu_2$ denotes absolute magnetic permeability of the outer layer.

2. The composite bond wire of claim 1, wherein the material contains gold.

3. The composite bond wire of claim 1, further comprising:
    an additional layer of conductive material between the inner portion and the outer layer.

4. The composite bond wire of claim 3, wherein the additional layer of conductive material has an electrical resistance that is between the electrical resistance of the inner portion and the electrical resistance of the outer layer.

5. The composite bond wire of claim 1, wherein the inner portion is a mixture of a metal and submicron ceramic particles.

6. The composite bond wire of claim 1, wherein the first component is a metal and the second component is a submicron ceramic particle.

7. A bond wire, comprising:
- a core that is fabricated from a first material having a first conductivity;
- an outer layer surrounding the core, wherein the outer layer is fabricated from a second material having a second conductivity that is greater than the first conductivity; and
- an intermediate layer located between the core and the outer layer, wherein the intermediate layer is fabricated from a third material having a third conductivity that is greater than the first conductivity and less than the second conductivity.

8. The bond wire of claim 7, wherein the outer layer is fabricated from the second material to include a substantially constant thickness that is determined by a frequency of signals expected to be transmitted through the bond wire.

9. The bond wire of claim 8, wherein the thickness of the outer layer is a function of a skin depth of the frequency of signals expected to be transmitted through the bond wire.

10. The bond wire of claim 9, wherein the second material includes copper, the thickness of the outer layer is approximately 21 micrometers, and the frequency of signals expected to be transmitted through the bond wire is 10 megahertz.

11. The bond wire of claim 7, wherein the first material includes a mixture of one or more conductive materials and one or more insulating materials, and wherein the second material includes one or more conductive materials.

12. The bond wire of claim 11, wherein the one or more conductive materials include one or more metal materials, and wherein the one or more insulating materials include one or more ceramic materials.

13. The bond wire of claim 12, wherein the one or more ceramic materials comprise particles that are less than 100 micrometers in size.

14. The bond wire of claim 7, wherein the intermediate layer includes a first thickness selected for carrying a signal in a first frequency range, and wherein the outer layer includes a second thickness selected for carrying a signal in a second frequency range that is greater than the first frequency range.

15. An integrated circuit, comprising:
- a substrate including a pad;
- a die mounted to the substrate; and
- a bond wire connecting the die to the pad, wherein the bond wire includes:
  - a core that includes a metal material and a plurality of submicron sized ceramic particles, wherein the core exhibits a first electrical resistance;
  - an outer layer surrounding the core, wherein the outer layer includes a precious metal material and exhibits a second resistance that is less than the first resistance; and
  - an intermediate layer located between the core and the outer layer, wherein the intermediate layer is fabricated from a third material having a third resistance that is less than the first resistance and greater than the second resistance.
- wherein the core has a first thickness that is greater than a first skin depth ($d_1$), the first skin depth ($d_1$) described by a first model equation expressed as:

$$d_1 = \sqrt{\frac{2\rho_1}{\omega_1 \mu_1}}$$

wherein $\rho_1$ denotes resistivity of core, $\omega_1$ denotes a first frequency of electrical signals to be applied to the composite bond wire, and $\mu_1$ denotes absolute magnetic permeability of the core, wherein the outer layer has a second thickness that is greater than a second skin depth ($d_2$), the second skin depth ($d_2$) described by a second model equation expressed as:

$$d_2 = \sqrt{\frac{2\rho_2}{\omega_2 \mu_2}}$$

wherein $\rho_2$ denotes resistivity of the outer layer, $\omega_2$ denotes a second frequency of electrical signals to be applied to the composite bond wire, and $\mu_2$ denotes absolute magnetic permeability of the outer layer, wherein the intermediate layer has a third thickness that is greater than a third skin depth ($d_3$), the third skin depth ($d_3$) described by a third model equation expressed as:

$$d_3 = \sqrt{\frac{2\rho_3}{\omega_3 \mu_3}}$$

wherein $\rho_3$ denotes resistivity of the outer layer, $\omega_3$ denotes a third frequency of electrical signals to be applied to the composite bond wire, and $\mu_3$ denotes absolute magnetic permeability of the outer layer.

16. The integrated circuit of claim 15, wherein the metal material included in the core is the same type of metal material as the precious metal material that is included in the outer layer.

17. The integrated circuit of claim 16, wherein the metal material and the precious metal material includes gold.

18. The integrated circuit of claim 16, wherein the intermediate layer has the third thickness determined by a skin depth associated with the third frequency range, and wherein the outer layer has the second thickness determined by a skin depth associated with the second frequency range, the second frequency range being greater than the third frequency range.

* * * * *